US008975910B2

(12) United States Patent  (10) Patent No.: US 8,975,910 B2
Graves-Abe et al.  (45) Date of Patent: Mar. 10, 2015

(54) THROUGH-SILICON-VIA WITH SACRIFICIAL DIELECTRIC LINE

(75) Inventors: Troy L. Graves-Abe, Wappingers Falls, NY (US); Benjamin A. Himmel, Yorktown Heights, NY (US); Chandrasekharan Kothandaraman, Hopewell Junction, NY (US); Norman W. Robson, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 274 days.

(21) Appl. No.: 13/457,692

(22) Filed: Apr. 27, 2012

(65) Prior Publication Data

US 2013/0285694 A1  Oct. 31, 2013

(51) Int. Cl.
*G01R 31/26* (2014.01)
*H01L 21/28* (2006.01)
*H01L 21/768* (2006.01)
*H01L 21/66* (2006.01)
*G01R 31/28* (2006.01)

(52) U.S. Cl.
CPC ............ *H01L 22/14* (2013.01); *G01R 31/2853* (2013.01); *H01L 21/76898* (2013.01); *H01L 2924/00* (2013.01); *H01L 2924/0002* (2013.01)

USPC .................. 324/762.01; 324/762.05; 257/213

(58) Field of Classification Search
USPC .............................. 324/762.01; 257/206, 213
See application file for complete search history.

(56) References Cited

U.S. PATENT DOCUMENTS

| | | | |
|---|---|---|---|
| 6,842,028 B2 | 1/2005 | Song et al. | |
| 7,639,032 B2 | 12/2009 | Chanda et al. | |
| 7,821,051 B2 * | 10/2010 | Yang et al. | ..................... 257/301 |
| 7,977,962 B2 | 7/2011 | Hargan et al. | |
| 8,004,290 B1 | 8/2011 | Zhang et al. | |
| 2011/0080185 A1 | 4/2011 | Wu et al. | |
| 2011/0095435 A1 | 4/2011 | Volant et al. | |
| 2011/0291267 A1 | 12/2011 | Wang et al. | |
| 2011/0291268 A1 | 12/2011 | Wang et al. | |

* cited by examiner

*Primary Examiner* — Vincent Q Nguyen
(74) *Attorney, Agent, or Firm* — Schmeiser, Olsen & Watts; Steven Meyers

(57) ABSTRACT

A TSV structure, method of making the TSV structure and methods of testing the TSV structure. The structure including: a trench extending from a top surface of a semiconductor substrate to a bottom surface of the semiconductor substrate, the trench surrounding a core region of the semiconductor substrate; a dielectric liner on all sidewalls of the trench; and an electrical conductor filling all remaining space in the trench, the dielectric liner electrically isolating the electrical conductor from the semiconductor substrate and from the core region.

24 Claims, 13 Drawing Sheets

US 8,975,910 B2

THROUGH-SILICON-VIA WITH SACRIFICIAL DIELECTRIC LINE

FIELD OF THE INVENTION

The present invention relates to the field of integrated circuit chips; more specifically, it relates to through-silicon-vias and methods of fabricating through-silicon-vias of integrated circuit chips.

BACKGROUND

Through-silicon-vias are electrically conductive structures that extend from the back surface to the front surface of the silicon substrate of integrated circuits. A dielectric liner between the electrically conductive core and the silicon substrate prevents the electrically conductive core from shorting to the silicon substrate. During fabrication, it is necessary to stress test these vias during the fabrication process. After stress testing, the integrated circuit chips are discarded regardless of whether the chips pass the stress test or not because of reliability concerns. This is expensive and wasteful. Accordingly, there exists a need in the art to eliminate the deficiencies and limitations described hereinabove.

SUMMARY

A first aspect of the present invention is a structure, comprising: a trench extending from a top surface of a semiconductor substrate to a bottom surface of the semiconductor substrate, the trench surrounding a core region of the semiconductor substrate; a dielectric liner on all sidewalls of the trench; and an electrical conductor filling all remaining space in the trench, the dielectric liner electrically isolating the electrical conductor from the semiconductor substrate and from the core region.

A second aspect of the present invention is a method, comprising: forming a trench extending from a top surface of a semiconductor substrate to a bottom surface of the semiconductor substrate, the trench surrounding a core region of the semiconductor substrate; forming a dielectric liner on all sidewalls of the trench; and filling all remaining space in the trench with an electrical conductor, the dielectric liner electrically isolating the electrical conductor from the semiconductor substrate and from the core region.

A third aspect of the present invention is a method, comprising: providing a structure comprising: a trench extending from a top surface of a semiconductor substrate into but not through the semiconductor substrate, the trench surrounding a core region of the semiconductor substrate; a dielectric liner on all sidewalls and a bottom of the trench; and an electrical conductor filling all remaining space in the trench, the dielectric liner electrically isolating the electrical conductor from the semiconductor substrate and from the core region; and testing the dielectric liner by applying a direct current voltage between the electrical conductor and the core region of the semiconductor substrate and measuring a current flow from the electrical conductor and the core region of the semiconductor substrate.

A fourth aspect of the present invention is a method, comprising: providing a structure comprising: a trench extending from a top surface of a semiconductor substrate to a bottom surface the semiconductor substrate, the trench surrounding a core region of the semiconductor substrate; a dielectric liner on all sidewalls and a bottom of the trench; and an electrical conductor filling all remaining space in the trench, the dielectric liner electrically isolating the electrical conductor from the semiconductor substrate and from the core region; and testing the dielectric liner by applying a direct current voltage between the electrical conductor and the core region of the semiconductor substrate and measuring a current flow from the electrical conductor and the core region of the semiconductor substrate.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

DETAILED DESCRIPTION

Because of the high aspect ratio (i.e., width to depth) of through-silicon-vias (TSVs) the integrity (e.g., local thickness and composition and local dielectric constant) of the dielectric liner of the TSV must be stress tested at high voltage (i.e., an accelerated wear out or life test) to ensure the reliability of shipped parts. However, the high voltage stress testing itself can degrade the dielectric liner and shorten the expected lifetime of the integrated circuit chip. The TSVs according to embodiments of the present invention provide an electrically conductive core between an inner and sacrificial region of the dielectric liner and an outer region of the dielectric liner. The inner region of the dielectric liner is not relied upon for insulating the electrically conductive core of the TSV from the silicon substrate of the integrated chip in use in the field and thus may be stress tested at high voltage with no concern for field failures due to the stress test itself. Thus, the expected life-time of the TSV has not been degraded by stress testing yet the reliability of integrated circuit chips that pass the stress test can be shipped. The sacrificial inner region of the dielectric liner is "sacrificial" in the sense that the integrity of sacrificial inner region dielectric liner has been sacrificed. It should also be understood that the abbreviation TSV can also stand for through-substrate-via when the substrate is not silicon.

FIGS. 1 to 8 illustrate fabricating and testing of a TSV according to an embodiment of the present invention. FIGS. 9, 9A and 9B illustrate an alternative through-silicon-via according to an embodiment of the present invention.

Figure 1:
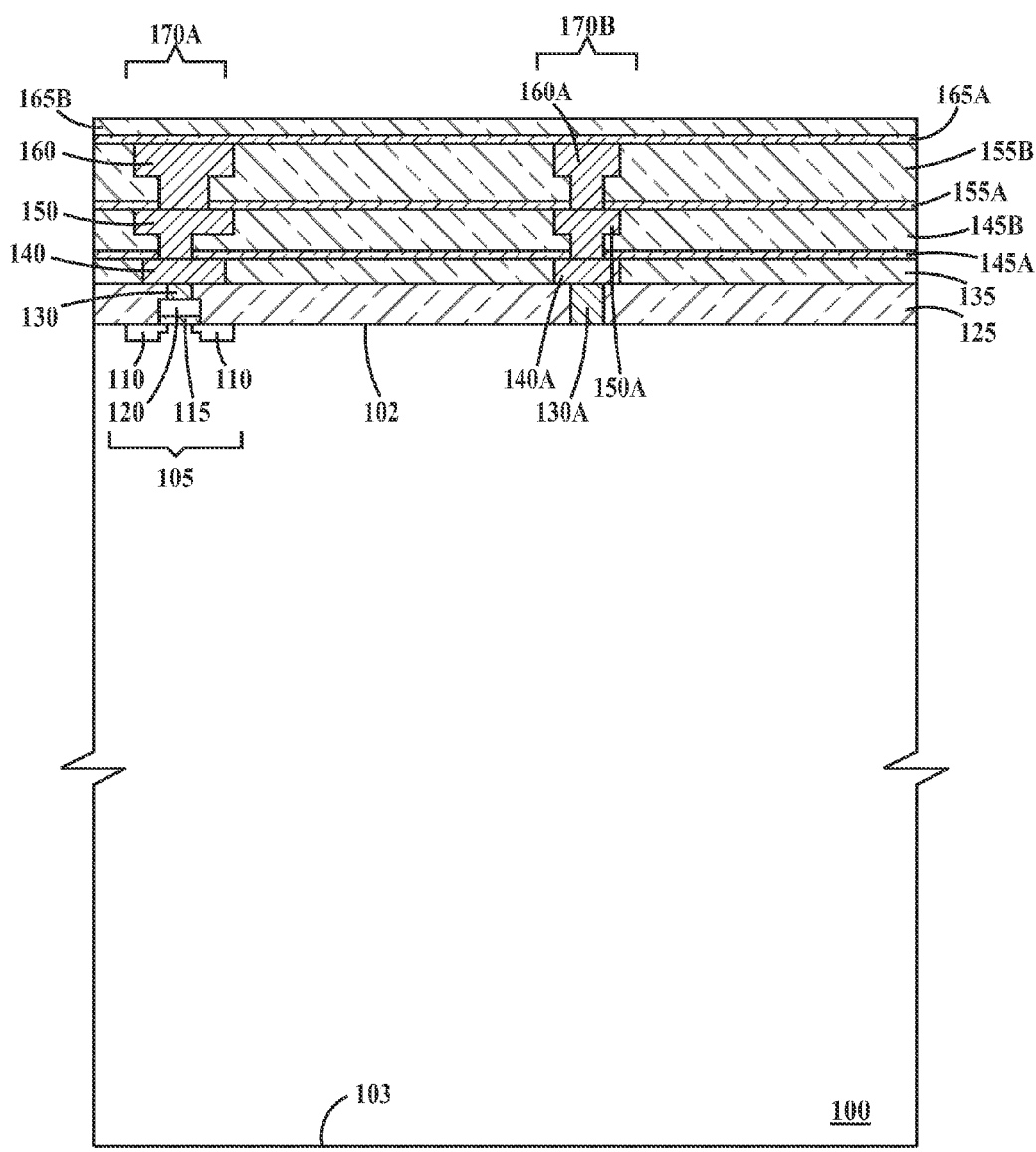
FIGS. 1 to 8 illustrate fabricating and testing of a through-silicon-via according to an embodiment of the present invention.

FIG. 1 is a cross-section view of a region of an integrated chip where a TSV will be formed. In FIG. 1, a substrate (e.g., a single-crystal silicon substrate) has a top surface 102 and a bottom surface 103. An exemplary field effect transistor 105 includes source/drains 110 formed in substrate 100 proximate to top surface 102, and a gate dielectric layer 115 and a gate electrode 120. Hereinafter, all wires and contacts are defined as being electrically conductive. A first interlevel dielectric layer 125 is formed on top surface 102 of substrate 100. First interlevel dielectric layer 125 includes a damascene contact 130 to FET 105 and a damascene contact 130A to substrate 100. Formed on the top surface of first interlevel dielectric layer 125 is a second interlevel dielectric layer 135. Formed in second interlevel dielectric layer 135 is a damascene wire 140 contacting damascene contact 130 and a damascene wire 140A contacting damascene contact 130A. Formed on the top surface of second interlevel dielectric layer 135 are a third interlevel dielectric layer 145A and an interlevel fourth dielectric layer 145B. Formed in third and fourth interlevel dielectric layers 145A and 145B is a dual-damascene wire 150 contacting damascene wire 140 and a dual damascene wire 150A contacting damascene wire 140A. Formed on the top surface of fourth interlevel dielectric layer 145B are a fifth interlevel dielectric layer 155A and a sixth interlevel dielectric layer 155B. Formed in fifth and sixth interlevel dielectric layers 155A and 155B are a dual-damascene wire 160 contacting dual-damascene wire 150 and a dual damascene wire 160A contacting dual-damascene wire 150A. Formed on the top surface of sixth interlevel dielectric layer 155B are a seventh interlevel dielectric layer 165A and an eighth interlevel dielectric layer 165B. Thereby there is an electrical path from dual-damascene wire 160 to FET 105 and an electrical path from dual-damascene wire 160A to substrate 100. Damascene contact 130, damascene wire 140 and dual damascene wires 150 and 160 comprise a wire stack 170A which provides electrical contact to FET 105. Damascene contact 130A, damascene wire 140A and dual damascene wires 150A and 160A comprise a wire stack 170B which provides electrical contact to substrate 100. In one example, dielectric interlevel layers 145A, 155A and 165A comprise a material that is a diffusion barrier to copper. In one example, interlevel dielectric layers 145A, 155A and 165A comprise silicon nitride. In one example, interlevel dielectric layers 125, 135, 145B, 155B and 165B comprise silicon oxide. In one example, interlevel dielectric layer 165B comprises tetraethylorthosilicate (TEOS). In one example, contacts 130 and 130A comprise tungsten and wires 140, 140A, 150, 150A, 160 and 160A comprise copper.

A damascene wire or contact is a wire or contact formed by processes in which wire trenches or via openings are formed in an interlevel dielectric layer, an electrical conductor of sufficient thickness to fill the trenches is deposited in the trenches and on a top surface of the interlevel dielectric layer. A chemical-mechanical-polish (CMP) process is performed to remove excess conductor and make the surface of the conductor co-planar with the surface of the interlevel dielectric layer to form damascene wires (or damascene vias). A dual-damascene wire or contact is a wire or contact formed in either a via first dual-damascene process or a trench first dual-damascene process. In a via first dual-damascene process, via openings are formed through the entire thickness of an interlevel dielectric layer followed by formation of trenches part of the way through the interlevel dielectric layer in any given cross-sectional view. In a trench first dual-damascene process is one in which trenches are formed part way through the thickness of an interlevel dielectric layer followed by formation of vias inside the trenches the rest of the way through the interlevel dielectric layer in any given cross-sectional view. All via openings are intersected by integral wire trenches above and by a wire trench below, but not all trenches need intersect a via opening. An electrical conductor of sufficient thickness to fill the trenches and via opening is deposited on a top surface of the dielectric and a CMP process is performed to make the surface of the conductor in the trench co-planar with the surface the interlevel dielectric layer to form dual-damascene wires and dual-damascene wires having integral dual-damascene vias. Wiring levels are comprised of the interlevel dielectric layer and the corresponding damascene and/or dual damascene wires formed in the interlevel dielectric layer.

Figure 2:
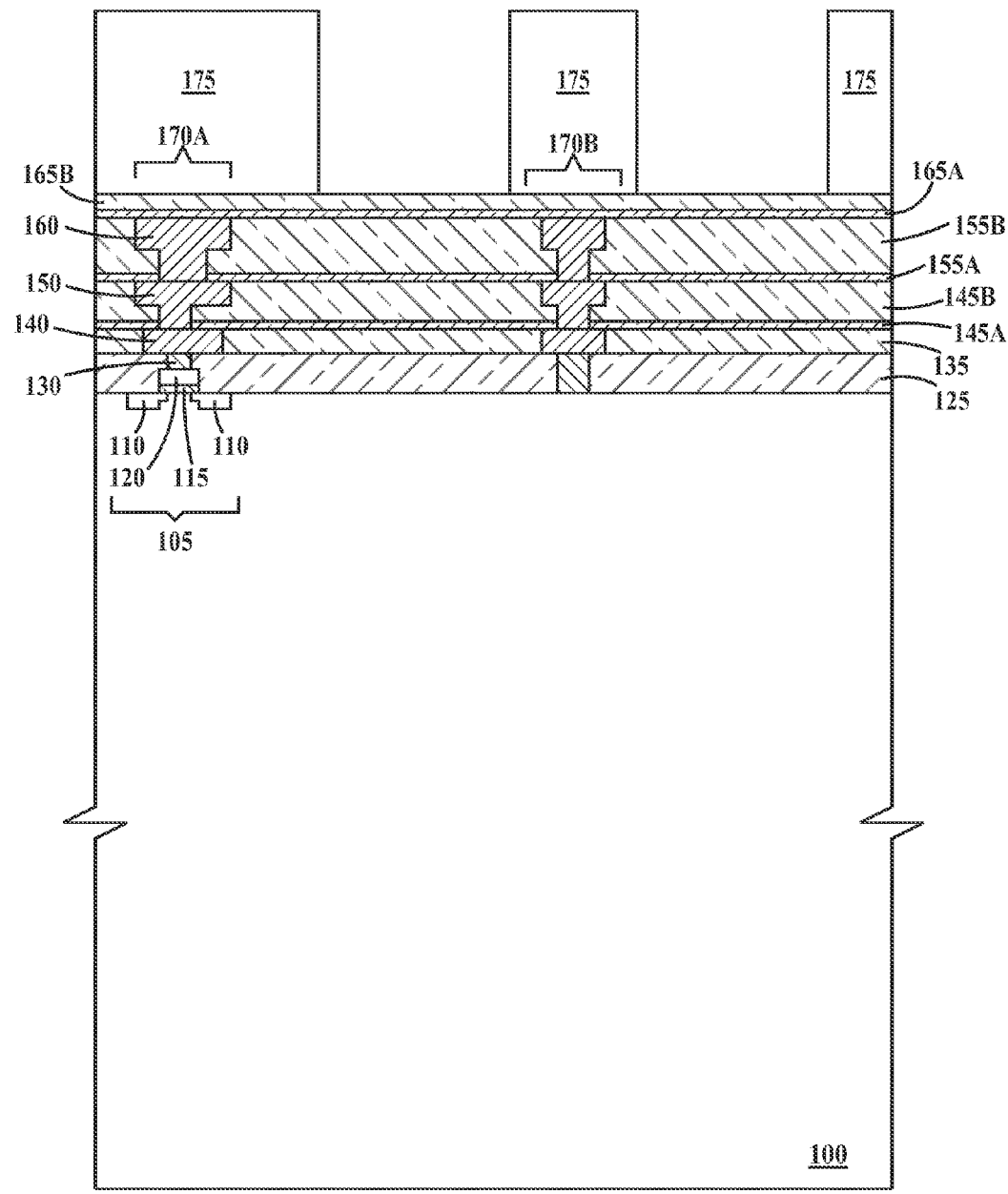
Figure 3:
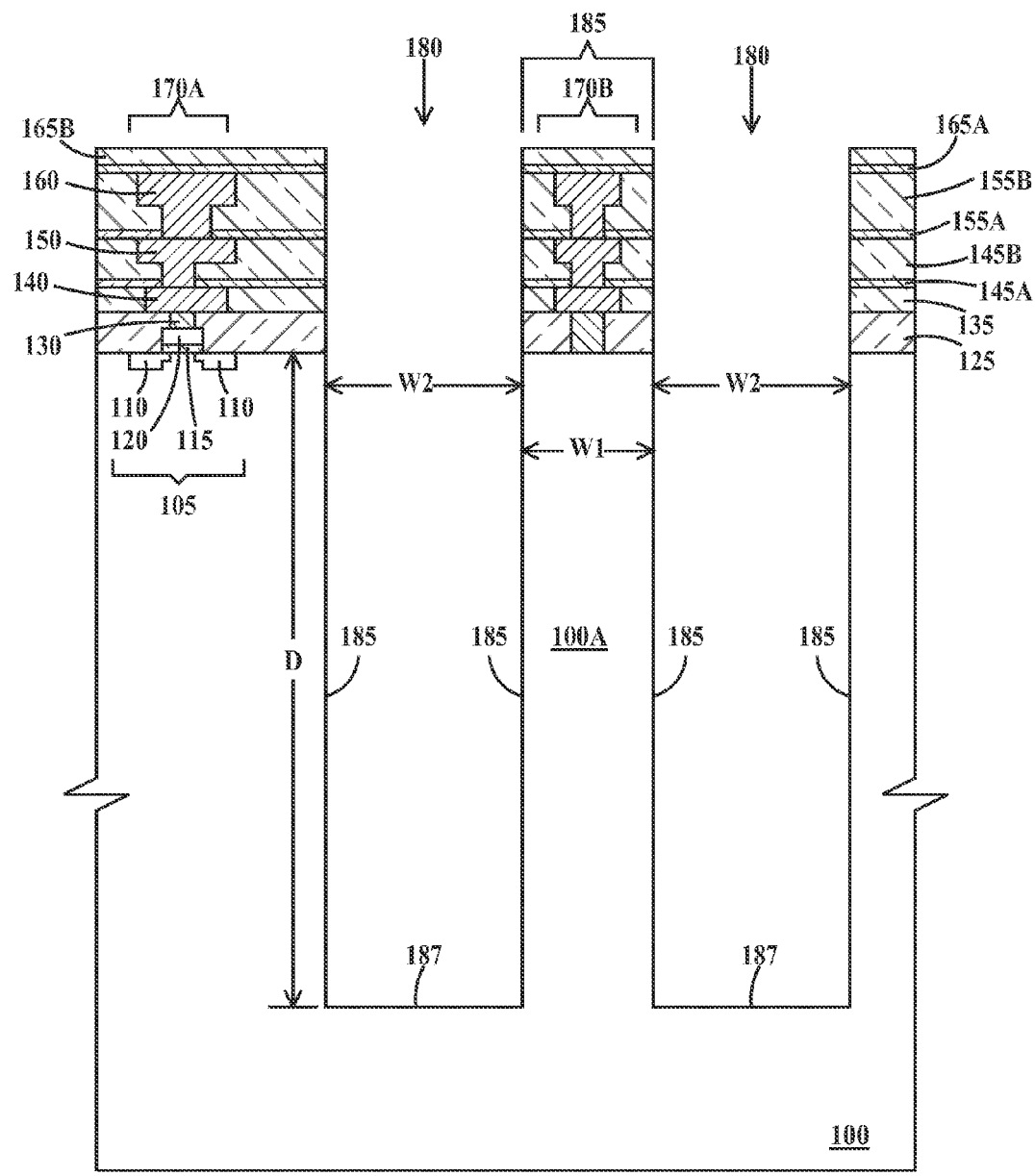
Figure 3A:
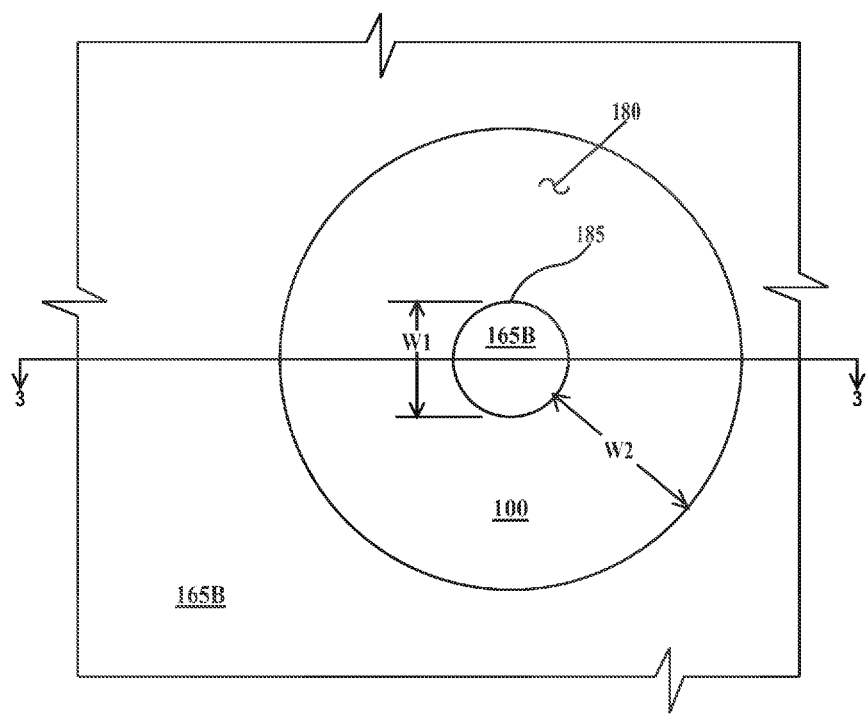

In FIG. 2, a patterned photoresist layer 175 is formed on the top surface of dielectric layer 165B over wire stack 170A and wire stack 170B. In FIGS. 3 and 3A, an annular trench 180 (see FIG. 3A) having sidewalls 185 and a bottom 187 is etched (in one example, by one or more reactive ion etch (RIE) processes) through dielectric layers 125, 135, 145A, 145B, 155A, 155B, 165A and 165B and into substrate 100 a depth D. FIG. 3 is a sectional view through line 3-3 of FIG. 3A. Trench 180 surrounds a core 100A of substrate 100. Core 100A has a width W1 and trench 180 has a width W2. In one example, D is between about 1 micron and about 100 microns. In one example, W1 is between about 0.1 micron and about 10 microns. In one example, W2 is between about 1 microns and about 20 microns. Photoresist layer 175 (see FIG. 2) is removed after trench 180 is etched. There are no devices (e.g., FETs, diodes, capacitors) formed in core 100A.

Figure 4:
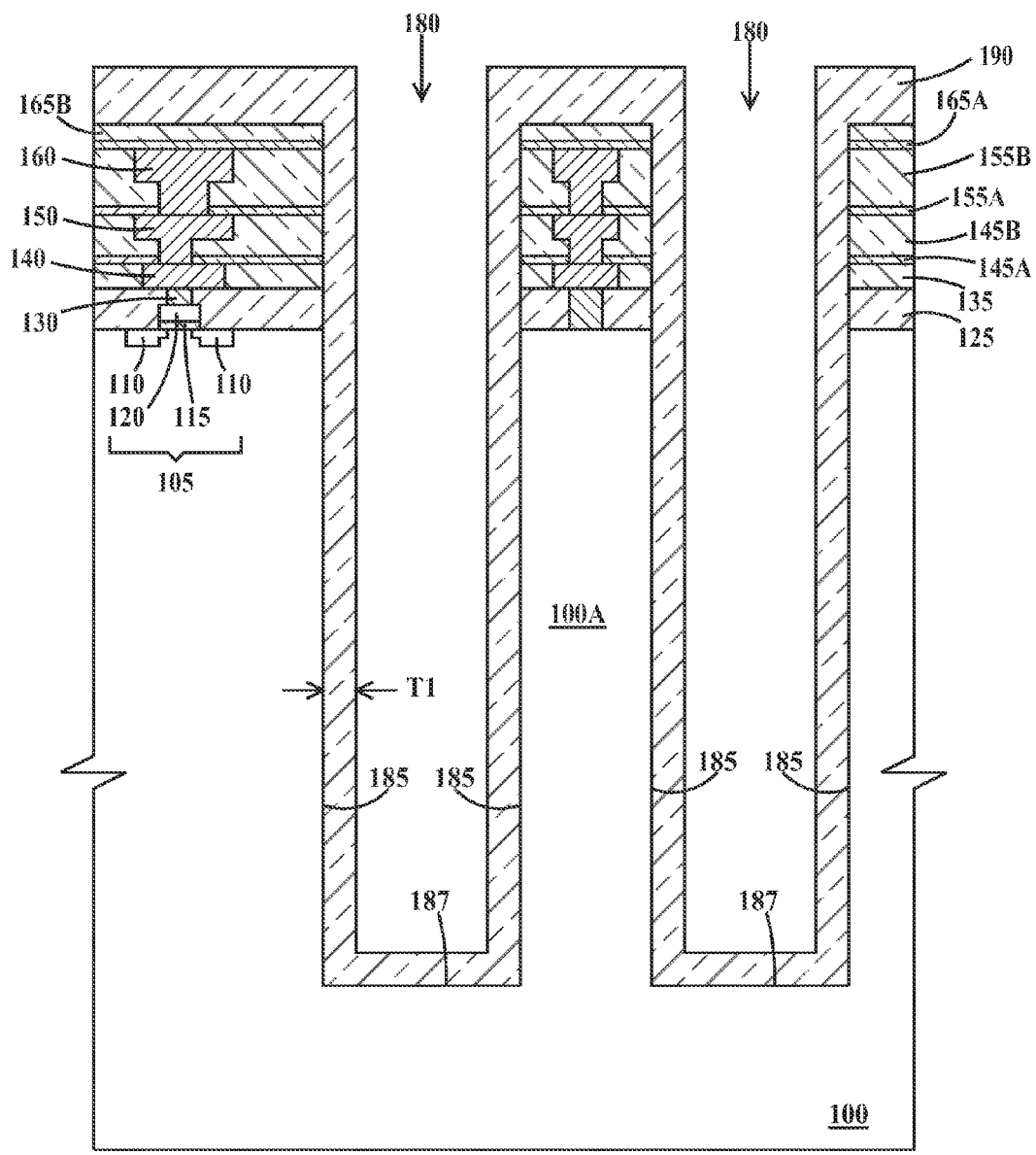

In FIG. 4, a dielectric liner 190 is formed on sidewalls 185 and bottom 187 of trench 180 as well as on the top surface of dielectric layer 165B. Dielectric liner 190 has a thickness T1 on sidewalls 185 of trench 180. In one example, T1 is between about 0.1 microns and about 3 microns. In one example, dielectric layer comprises plasma enhanced chemical vapor deposition (PECVD) silicon oxide.

Figure 5:
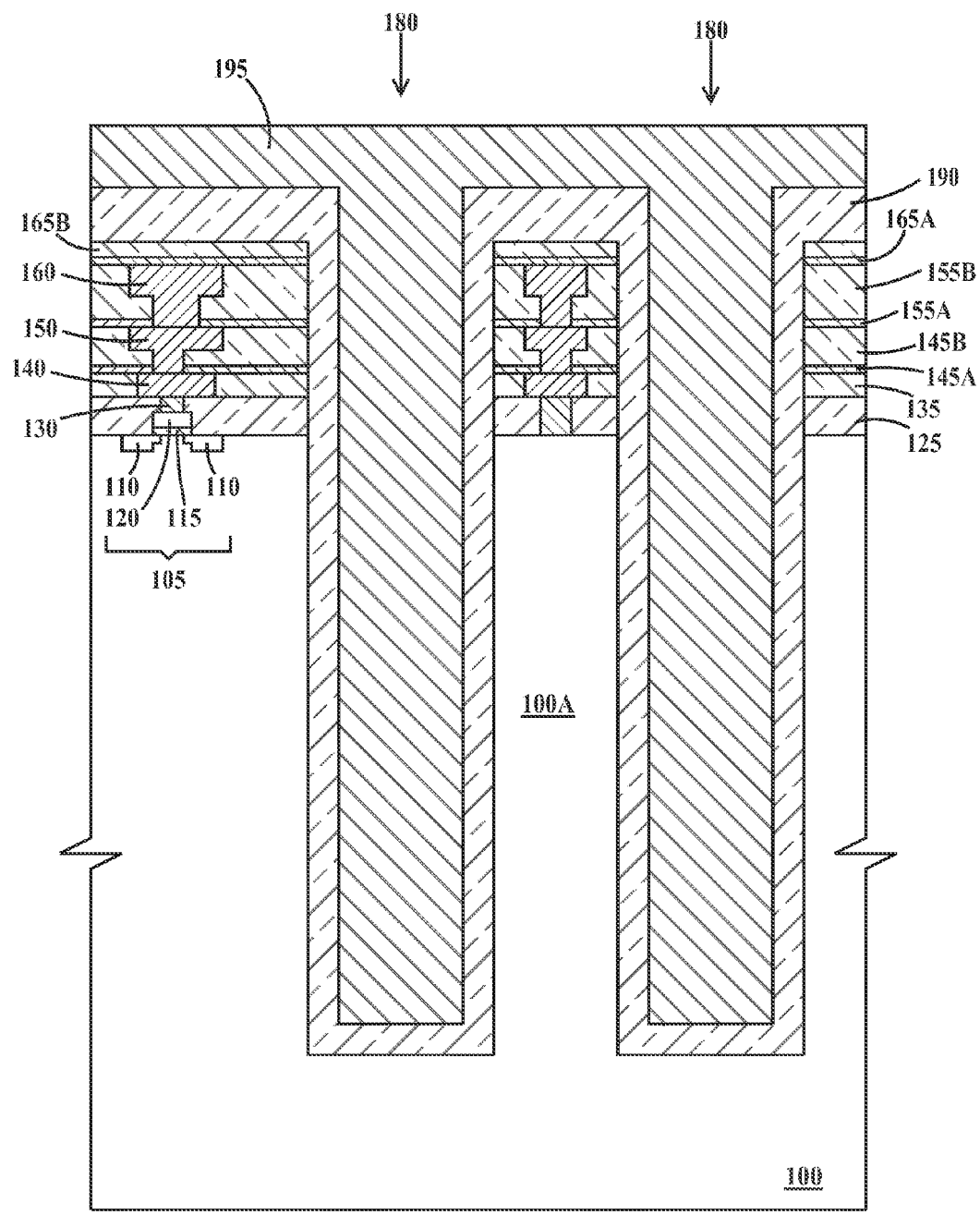
Figure 5A:
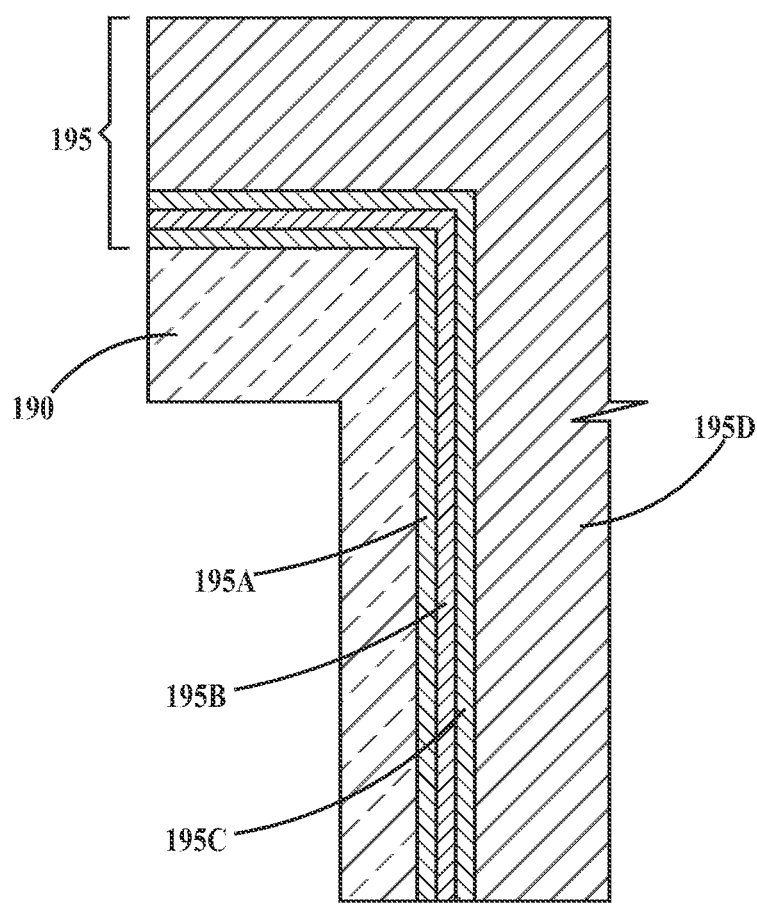

In FIG. 5, an electrical conductor 195 is formed in trench 180 and on the top surface of dielectric liner 190. Conductor 195 completely fills the remaining space in trench 180. Turning to FIG. 5A, in one example, conductor 195 comprises a tantalum nitride (TaN) layer 195A deposited on the exposed surface of dielectric liner 190, a tantalum (Ta) layer 195B deposited on the exposed surface of TaN layer 195A, copper-manganese (Cu—Mn) layer 195C deposited on the exposed surface of Ta layer 195B, and an electroplated copper core 195D.

Figure 6:
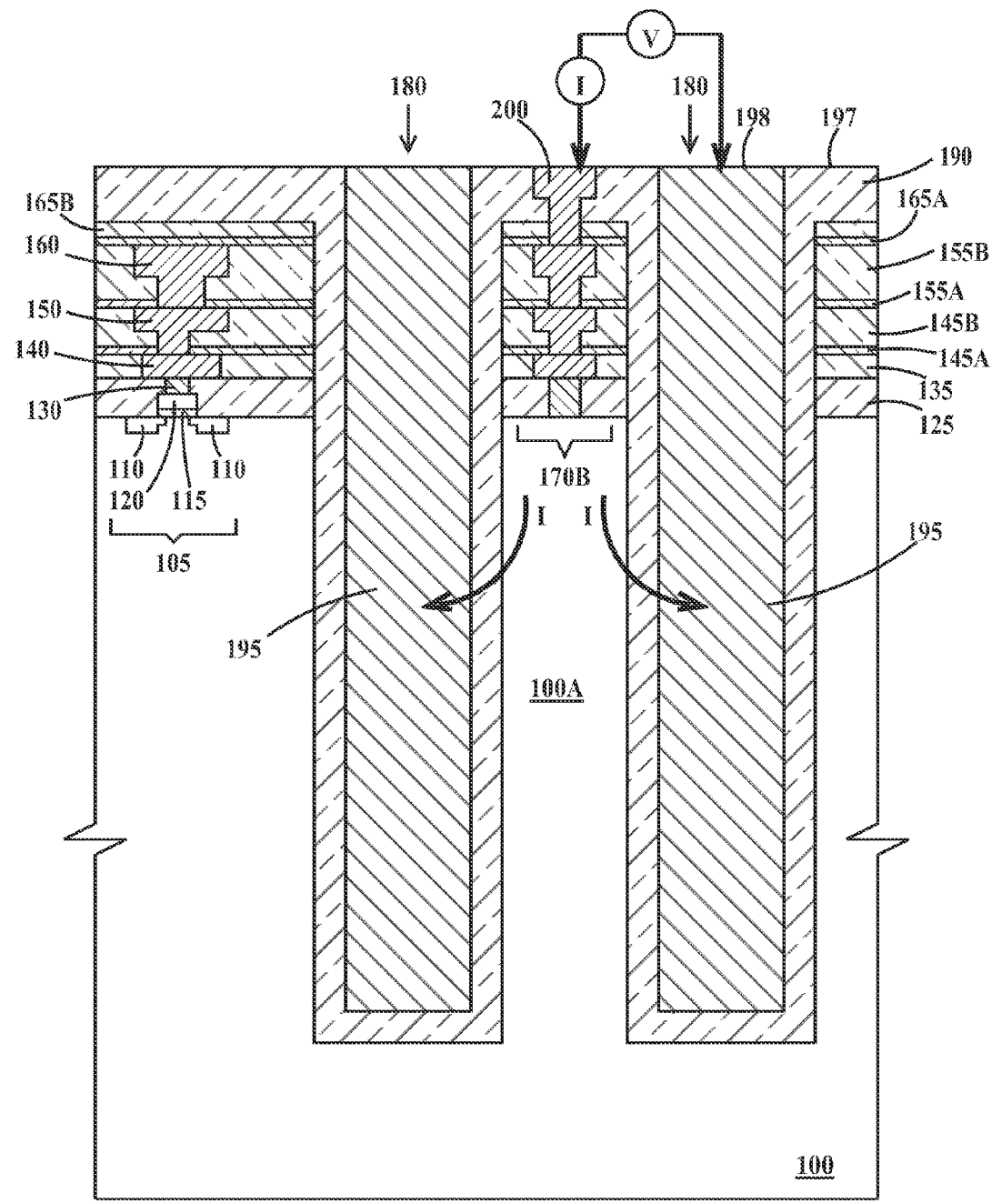
Figure 6A:
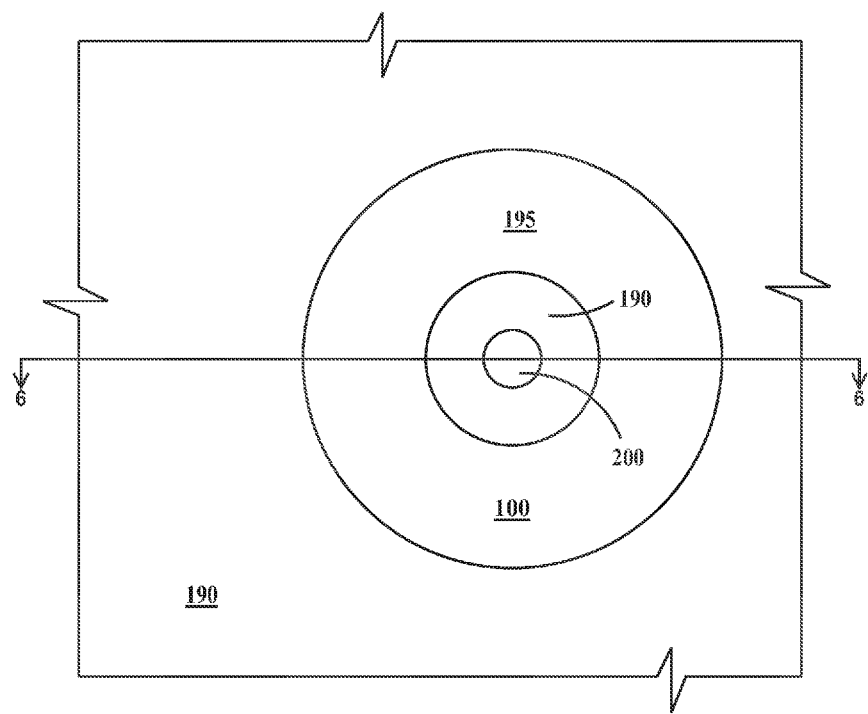

In FIGS. 6 and 6A, a chemical-mechanical polish (CMP) process is performed to remove conductor from the top surface of dielectric liner 190, so top surface 197 of dielectric liner 190 is coplanar with top surface 198 of conductor 195. A damascene stack contact 200 is formed through dielectric liner 190 and dielectric layers 165A and 165B to wire stack 170B. Wire stack 170B is isolated from electrical conductor 195 by dielectric layers 125, 135, 145A, 145B, 155A, 155B, 165A and 165B as well as by dielectric layer 195. FIG. 6 is a sectional view through line 6-6 of FIG. 6A. At this point, a high voltage stress test may be performed to test the integrity (resistance to current flow and dielectric breakdown) of dielectric liner 190. The high voltage stress includes applying a direct current (DC) voltage between the top surface 198 of conductor 195 and a damascene stack contact 200 and measuring the current flow. The current flow (if any) will be between the inner region of dielectric liner 190 between core 100A and conductor 195 leaving the outer region of dielectric liner 195 between the rest of substrate 100 and conductor 195 unstressed. For a P-type substrate, the positive bias is applied to stack contact 200. For an N-type substrate, the positive bias is applied to conductor 195. In one example, the voltage level is selected to apply an electrical field of between about 0.5 MV/cm and about 20 MV/cm to dielectric liner 195. An exemplary electrical field strength would be about 3 MV/cm or greater and is applied for a typical duration of about one second. During testing, trench 180 does not extend all the way through substrate 100.

While in FIG. 6, the stress test has been illustrated as being performed after four wiring levels (not counting stack contact 200) have been completed, the stress test may be performed after formation of any wiring level by adjustments to the process flow described. However, it is preferred that conductor 195 not be wired to any other wires of the integrated circuit until after the high voltage stress test.

Figure 7:
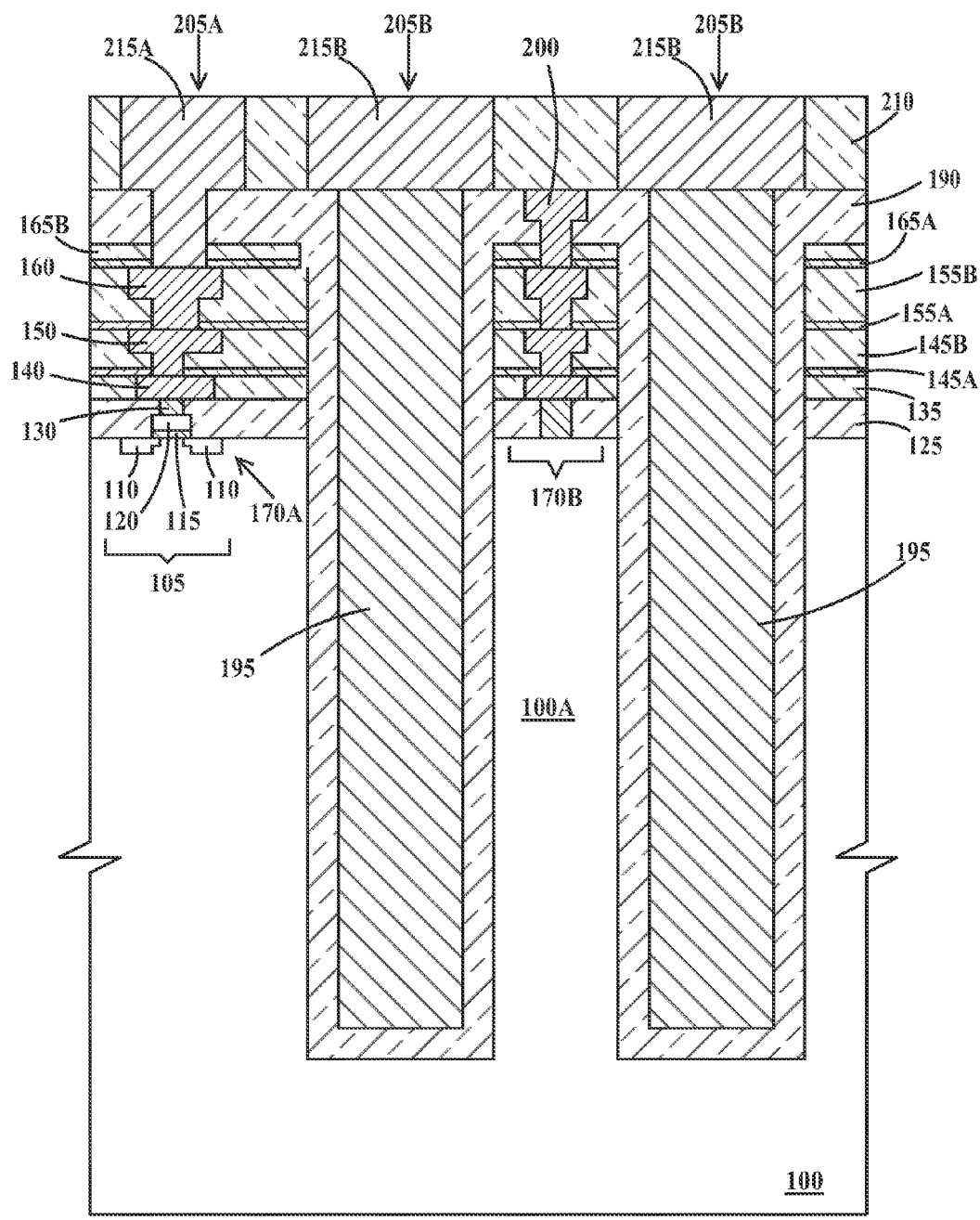

In FIG. 7, a dielectric layer 210 is formed on dielectric liner 190 and conductor 195. A dual damascene wire 215A is formed to wire stack 170A and a damascene wire 205B is formed to conductor 195. As illustrated, wire 215B does not contact wire stack 170B. In one example, dielectric layer 210 comprises multiple dielectric layers. In one example, dielectric layer 210 comprises a layer of silicon nitride on dielectric liner 190 and conductor 195, a layer of TEOS on the silicon nitride layer, and a layer of fluoro-TEOS (FTEOS) on the TEOS layer.

Figure 8:
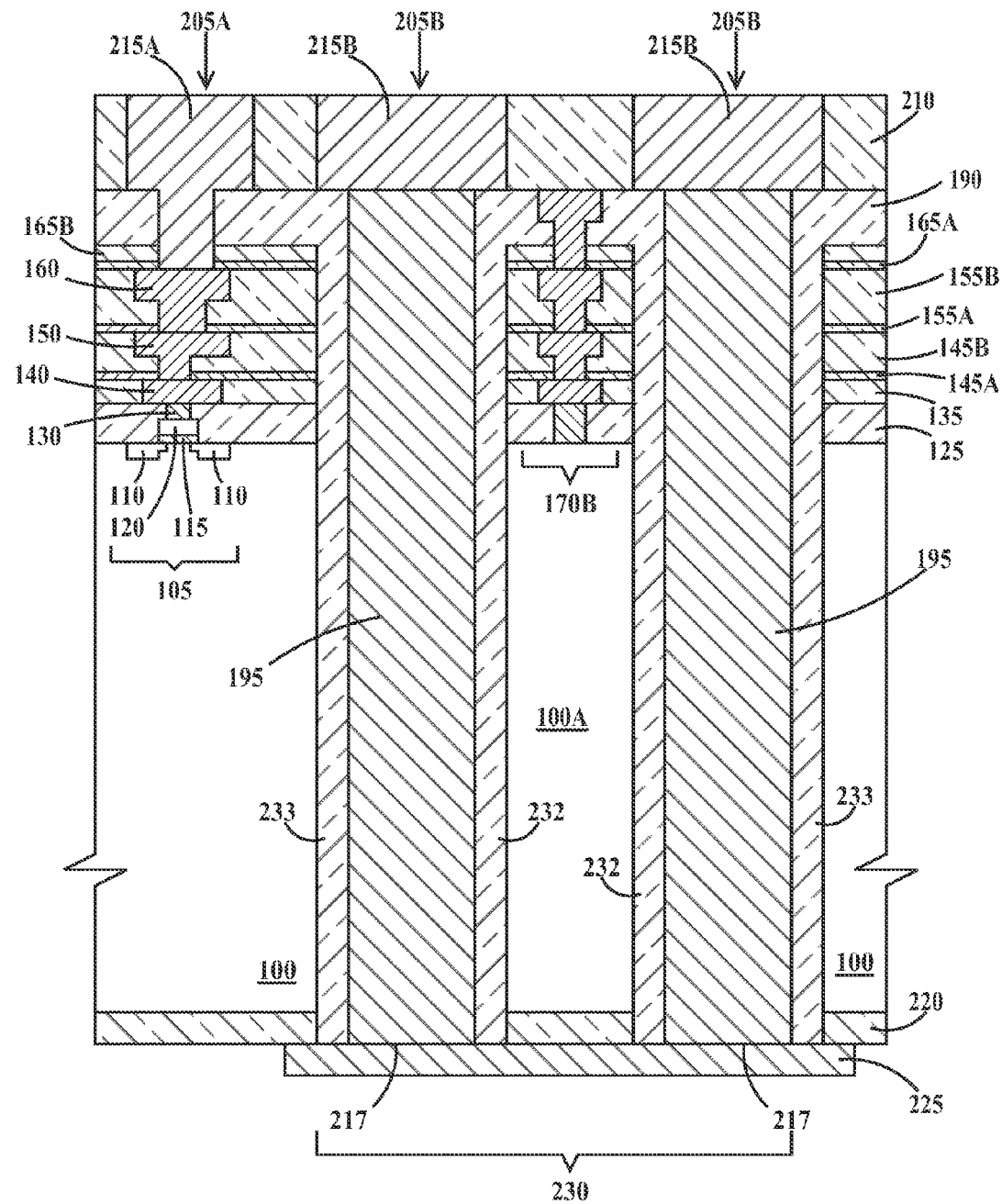
Figure 9:
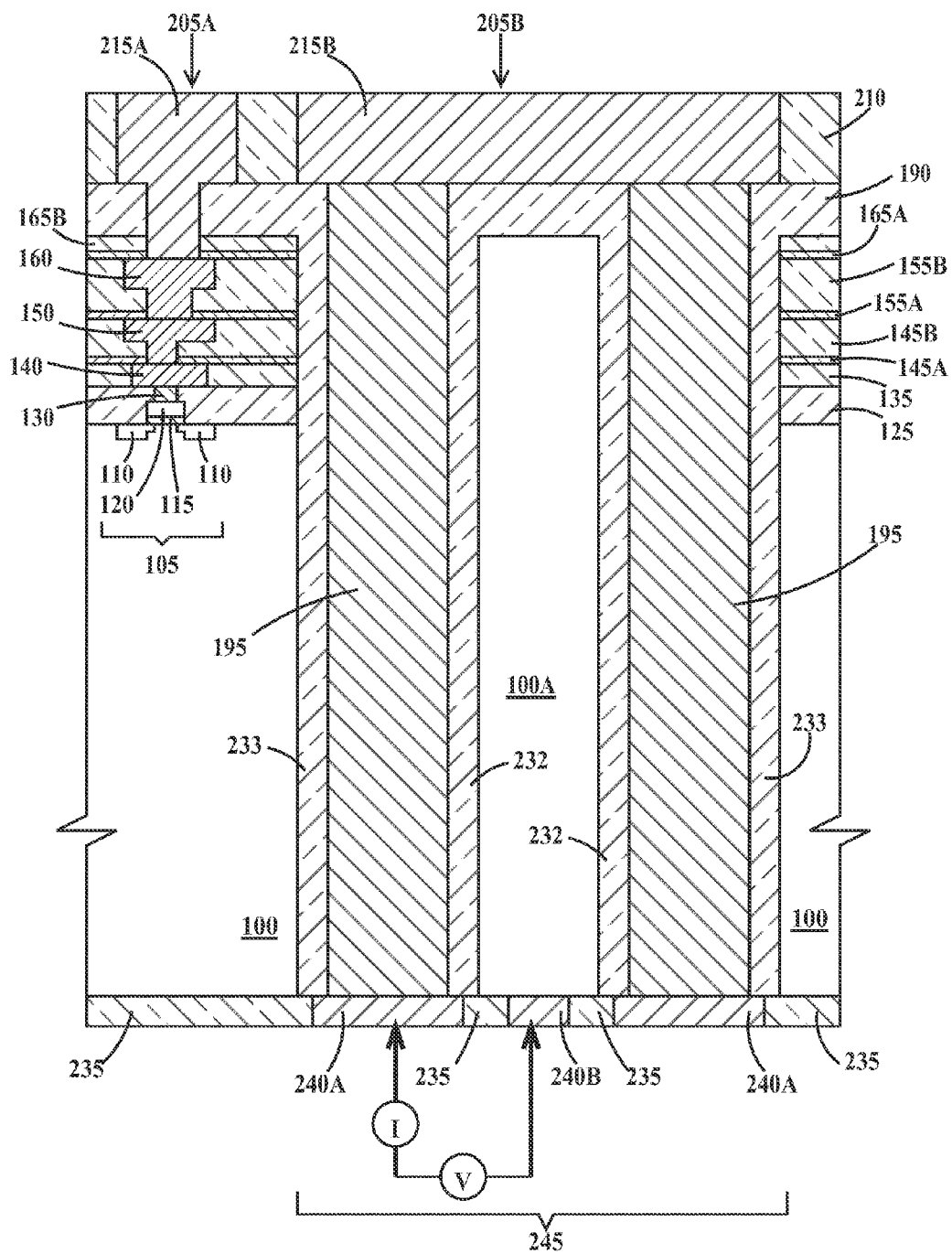
FIGS. 9, 9A and 9B illustrate an alternative through-silicon-via according to an embodiment of the present invention.
Figure 9A:
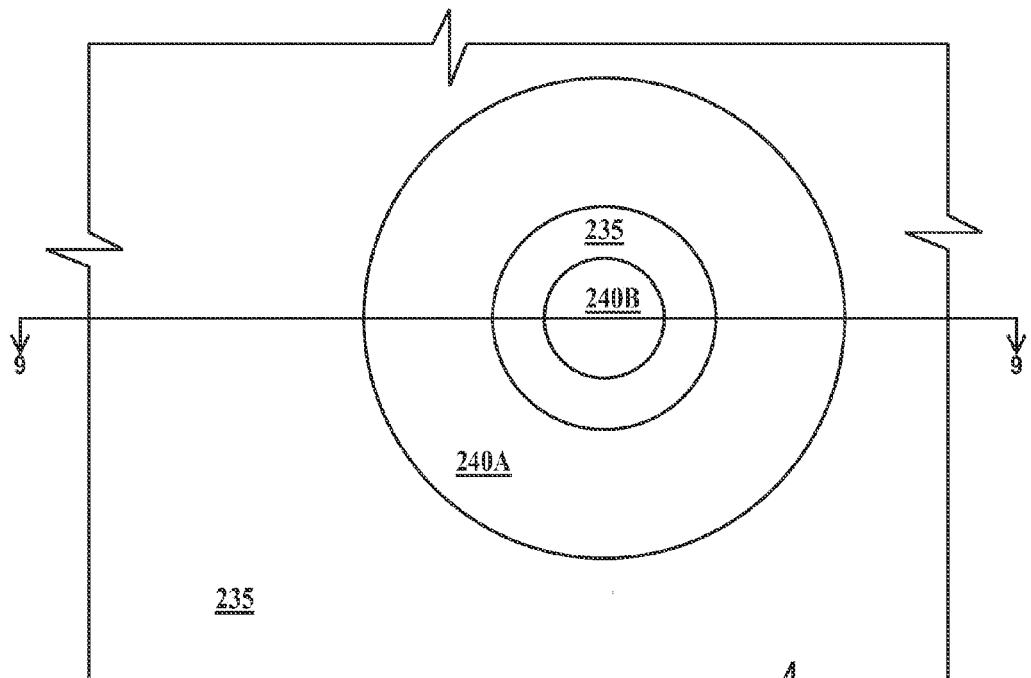
Figure 9B:
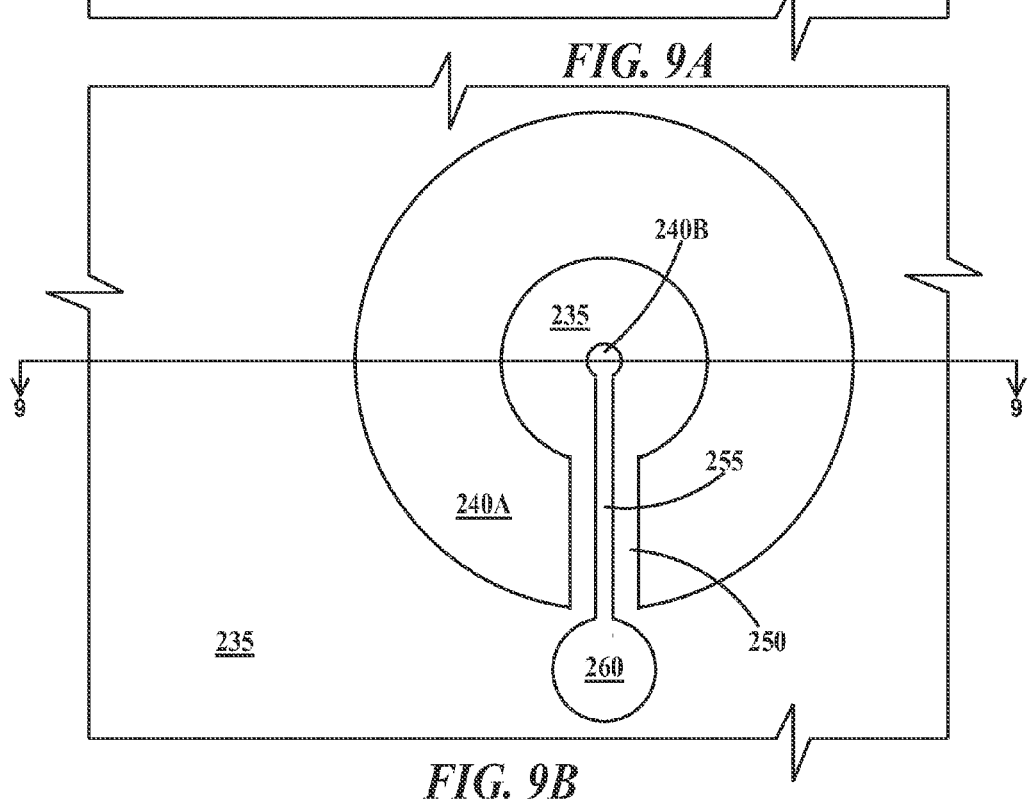

In FIG. 8, a backside grind followed by a substrate etch of substrate 100 has been performed to expose conductor 195, followed by a deposition of a dielectric layer 220 (e.g., silicon nitride), followed by a CMP to expose a bottom surface 217 of conductor 195. An electrically conductive layer 225 is optionally formed to contact bottom surface 217 of conductor 195. Thus, a TSV 230 comprising dielectric liner 190, conductor 190, core 100A and wire stack 170B has been formed. Because core 100A is isolated from substrate 100, it does not matter if the integrity (defined supra) of the inner region 232 of dielectric liner 195 contacting core 100A has been compromised by the stress test, because the outer region 233 of dielectric liner gas not been stressed and provides the isolation of TSV 230 from substrate 100. Alternatively, wire 215A and 215B could be integrally formed to provide a direct electrical connection between TSV 230 and FET 105

FIGS. 9, 9A and 9B illustrate an alternative through-silicon-via according to an embodiment of the present invention. In FIGS. 9, 9A and 9B the structure illustrated is fabricated and the stress testing is performed from the backside of the substrate after thinning the substrate as described supra. In FIG. 9, dielectric layer 235 is formed on the backside of substrate 100 and damascene wire 240A and 240B formed in dielectric layer 235. Wire 240A contacts conductor 195 and wire 240B contacts core 100A. The high voltage stress includes applying a direct current (DC) voltage between wire 240A and wire 240B and measuring the current flow. The current flow (if any) will be between the inner region of dielectric liner 190 between core 100A and conductor 195 leaving the region of dielectric liner 195 between the rest of substrate 100 and conductor 195 unstressed. For a P-type substrate, the positive bias is applied to wire 240B. For an N-type substrate, the positive bias is applied to wire 240A. In one example, the voltage level is selected to apply an electrical field of between about 0.5 MV/cm and about 20 MV/cm to dielectric liner 195. An exemplary electrical field strength would be about 3 MV/cm or greater and the field is applied for a duration of about one second. Thus a TSV 245 comprising dielectric liner 190 and electrical conductor 195 has been formed. Because core 100A is isolated from substrate 100, it does not matter if the integrity (defined supra) of the inner region 232 of dielectric liner 195 contacting core 100A has been compromised by the stress test, because the outer region 233 of dielectric liner gas not been stressed and provides the isolation of TSV 245 from substrate 100.

FIG. 9 is a sectional view through line 9-9 of FIG. 9A or alternatively through line 9-9 of FIG. 9B. The difference between FIGS. 9A and 9B is a gap 250 is provided in wire 240A for a wire 255 connecting wire 240B to a pad 260. In FIG. 9B, wire 240B, wire 255 and pad 260 are integrally formed.

In FIG. 9, the stress test has been illustrated as being performed on the grinded side (i.e., backside) of the substrate after four wiring levels have been completed on the non-grinded side (i.e., frontside) of the substrate. However, the stress test may be performed after formation of any wiring level by adjustments to the process flow described. It is preferred that conductor 195 not be wired to any other wires of the integrated circuit until after the high voltage stress test. It is also preferred that the stress test be performed after forming all wiring levels on the non-grinded surface and prior to forming terminal pads on the wires on the non-grinded surface of substrate 100.

TSVs according the embodiments of the present invention may be used, after high-voltage stress testing, in functional circuits of integrated circuit chips that are shipped to customers. Alternatively, TSVs according the embodiments of the present invention may be used as dummy, stress test only structures, of integrated circuit chips that are shipped to customers.

While, TSVs according to embodiments of the present invention have been illustrated in FIGS. 3A, 6A, 9A and 9B as having a circular perimeter when viewed from the top surface of the substrate, TSVs according to embodiments of the present invention may have oval, square, rectangular, polygon or irregular perimeters when viewed from the top surface of the substrate.

Thus, the embodiments of the present invention provide an integrated circuit chip TSV with a sacrificial dielectric liner that may be stress tested at high voltage and if the TSV passes the stress test, the integrated circuit chip may be shipped without wear out concerns.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. For example, silicon substrates may be replaced with other semiconductor substrates (e.g., SiGe) and TSV may then stand for "through-substrate-via). The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure, comprising:
   a trench extending from a top surface of a semiconductor substrate, completely through said semiconductor substrate, to a bottom surface of said semiconductor substrate, said trench surrounding a core region of said semiconductor substrate;
   a dielectric liner on all sidewalls of said trench; and
   an electrical conductor filling all remaining space in said trench, said dielectric liner electrically isolating said electrical conductor from said semiconductor substrate and from said core region.

2. The structure of claim 1, further including:
   one or more wiring levels each of said one or more wiring levels comprising an interlevel dielectric layer and damascene or dual-damascene wires, said one or more wiring levels formed on said top surface of said semiconductor substrate, said trench, said dielectric liner and said electrical conductor extending from said top of said semiconductor substrate to a top surface of an uppermost wiring level of said one or more wiring levels; and
   a stack of wires in said one or more wiring levels forming an electrical path to and contacting said core region, said stack of wires isolated from all other wires in said one or more wiring levels.

3. The structure of claim 2, further including:
   said dielectric liner extending over said top surface of said uppermost wiring level of said one or more wiring levels, a top surface of said electrical conductor coplanar with a top surface of said dielectric liner; and an electrically conductive stack contact in said dielectric liner over said core region, said stack contact contacting an uppermost wire of said stack of wires.

4. The structure of claim 3, further including:

a dielectric layer on said top surface of said dielectric liner, said top surface of said electrical conductor and a top surface of said stack contact; and a wire in said dielectric layer contacting said electrical conductor and not contacting said stack contact.

5. The structure of claim 1, further including:

a bottom dielectric layer formed on said bottom surface of said semiconductor substrate, said dielectric liner and said electrical conductor extending through said bottom dielectric layer, a surface of said bottom dielectric layer coplanar with bottom surfaces of said dielectric liner and said electrical conductor; and an electrically conductive bottom contact formed on said surface of said bottom dielectric layer, said dielectric liner and said electrical conductor, said bottom dielectric layer isolating said core region of said semiconductor substrate from said bottom contact.

6. The structure of claim 1, further including:

one or more wiring levels each of said one or more wiring levels comprising an interlevel dielectric layer and damascene or dual-damascene wires, said one or more wiring levels formed on said top surface of said semiconductor substrate; said trench, said dielectric liner and said electrical conductor extending from said top of said semiconductor substrate to a top surface of an uppermost wiring level of said one or more wiring level; and a first electrically conductive contact to a bottom surface of said electrical conductor and a second electrically conductive contact to a bottom surface of said core region of said semiconductor substrate, said first and second electrically conductive contacts isolated from each other and from said semiconductor substrate.

7. The structure of claim 6, further including:

said dielectric liner extending over said top surface of said uppermost wiring level of said one or more wiring levels and extending over said core region of said semiconductor substrate, a top surface of said electrical conductor coplanar with a top surface of said dielectric liner;

a dielectric layer on said top surface of said dielectric liner and said top surface of said electrical conductor; and a wire in said dielectric layer contacting said electrical conductor.

8. The structure of claim 1, wherein said electrical conductor comprises copper.

9. A method, comprising:

forming a trench extending from a top surface of a semiconductor substrate, completely through said semiconductor substrate, to a bottom surface of said semiconductor substrate, said trench surrounding a core region of said semiconductor substrate;

forming a dielectric liner on all sidewalls of said trench; and filling all remaining space in said trench with an electrical conductor, said dielectric liner electrically isolating said electrical conductor from said semiconductor substrate and from said core region.

10. The method of claim 9, further including:

forming one or more wiring levels each of said one or more wiring levels comprising an interlevel dielectric layer and damascene or dual-damascene wires, said one or more wiring levels formed on said top surface of said semiconductor substrate, said trench, said dielectric liner and said electrical conductor extending from said top of said semiconductor substrate to a top surface of an uppermost wiring level of said one or more wiring levels; and forming a stack of wires in said one or more wiring levels forming an electrical path to and contacting said core region, said stack of wires isolated from all other wires in said one or more wiring levels.

11. The method of claim 10, further including:

said dielectric liner extending over said top surface of said uppermost wiring level of said one or more wiring levels, a top surface of said electrical conductor coplanar with a top surface of said dielectric liner; and forming an electrically conductive stack contact in said dielectric liner over said core region, said stack contact contacting an uppermost wire of said stack of wires.

12. The method of claim 11, further including:

forming a dielectric layer on said top surface of said dielectric liner, said top surface of said electrical conductor and a top surface of said stack contact; and a wire in said dielectric layer contacting said electrical conductor and not contacting said stack contact.

13. The method of claim 9, further including:

a bottom dielectric layer formed on said bottom surface of said semiconductor substrate, said dielectric liner and said electrical conductor extending through said bottom dielectric layer, a surface of said bottom dielectric layer coplanar with bottom surfaces of said dielectric liner and said electrical conductor; and forming an electrically conductive bottom contact formed on said surface of said bottom dielectric layer, said dielectric liner and said electrical conductor, said bottom dielectric layer isolating said core region of said semiconductor substrate from said bottom contact.

14. The method of claim 9, further including:

forming one or more wiring levels each of said one or more wiring levels comprising an interlevel dielectric layer and damascene or dual-damascene wires, said one or more wiring levels formed on said top surface of said semiconductor substrate; said trench, said dielectric liner and said electrical conductor extending from said top of said semiconductor substrate to a top surface of an uppermost wiring level of said one or more wiring level; and forming a first electrically conductive contact to a bottom surface of said electrical conductor and a second electrically conductive contact to a bottom surface of said core region of said semiconductor substrate, said first and second electrically conductive contacts isolated from each other and from said semiconductor substrate.

15. The method of claim 14, further including:

said dielectric liner extending over said top surface of said uppermost wiring level of said one or more wiring levels and extending over said core region of said semiconductor substrate, a top surface of said electrical conductor coplanar with a top surface of said dielectric liner;

forming a dielectric layer on said top surface of said dielectric liner and said top surface of said electrical conductor; and forming a wire in said dielectric layer contacting said electrical conductor.

16. The method of claim 9, wherein said electrical conductor comprises copper.

17. A method, comprising:

providing a structure comprising:

a trench extending from a top surface of a semiconductor substrate into but not through said semiconductor substrate, said trench surrounding a core region of said semiconductor substrate;

a dielectric liner on all sidewalls and a bottom of said trench; and an electrical conductor filling all remaining space in said trench, said dielectric liner electrically isolating said electrical conductor from said semiconductor substrate and from said core region;

testing said dielectric liner by applying a direct current voltage between said electrical conductor and said core region of said semiconductor substrate and measuring a current flow from said electrical conductor and said core region of said semiconductor substrate; and after said testing said dielectric liner, thinning said semiconductor substrate from a bottom surface of said semiconductor substrate to expose bottom surfaces of said dielectric liner and said electrical conductor.

18. The method of claim 17, wherein a voltage level of said direct current voltage is selected to provide an electric field of about 3MV/cm or greater across a region of said dielectric liner between said core region of said semiconductor substrate and said electrical conductor.

19. The method of claim 17, wherein (i) when said semiconductor substrate is P-type a positive bias is applied to said core region of said semiconductor substrate and (ii) when said semiconductor substrate is N-type said positive bias is applied to said electrical conductor.

20. The method of claim 17, including:
said structure further including:
one or more wiring levels each comprising an interlevel dielectric layer and damascene or dual-damascene wires, said one or more wiring levels formed on said top surface of said semiconductor substrate, said trench, said dielectric liner and said electrical conductor extending from said top of said semiconductor substrate to a top surface of an uppermost wiring level of said one or more wiring levels;
a stack of wires in said one or more wiring levels forming an electrical path to and contacting said core region, said stack of wires isolated from all other wires in said one or more wiring levels;
said dielectric liner extending over said top surface of said uppermost wiring level of said one or more wiring levels, a top surface of said electrical conductor coplanar with a top surface of said dielectric liner; and
an electrically conductive stack contact in said dielectric liner over said core region, said stack contact contacting an uppermost wire of said stack of wires; and
said direct current voltage is applied between said electrical conductor and said stack contact.

21. A method, comprising:
providing a structure comprising:
a trench extending from a top surface of a semiconductor substrate, completely through said semiconductor substrate, to a bottom surface said semiconductor substrate, said trench surrounding a core region of said semiconductor substrate;

a dielectric liner on all sidewalls and a bottom of said trench; and an electrical conductor filling all remaining space in said trench, said dielectric liner electrically isolating said electrical conductor from said semiconductor substrate and from said core region; and testing said dielectric liner by applying a direct current voltage between said electrical conductor and said core region of said semiconductor substrate and measuring a current flow from said electrical conductor and said core region of said semiconductor substrate.

22. The method of claim 21, wherein a voltage level of said direct current voltage is selected to provide an electric field of about 3MV/cm or greater across a region of said dielectric liner between said core region of said semiconductor substrate and said electrical conductor.

23. The method of claim 21, wherein (i) when said semiconductor substrate is P-type a positive bias is applied to said core region of said semiconductor substrate and (ii) when said semiconductor substrate is N-type said positive bias is applied to said electrical conductor.

24. The method of claim 21, including:
said structure comprising:
one or more wiring levels each of said one or more wiring levels comprising an interlevel dielectric layer and damascene or dual-damascene wires, said one or more wiring levels formed on said top surface of said semiconductor substrate, said trench, said dielectric liner and said electrical conductor extending from said top of said semiconductor substrate to a top surface of an uppermost wiring level of said one or more wiring level;
a first electrically conductive contact to a bottom surface of said electrical conductor and a second electrically conductive contact to a bottom surface of said core region of said semiconductor substrate, said first and second electrically conductive contacts isolated from each other and from said semiconductor substrate;
said dielectric liner extending over said top surface of said uppermost wiring level of said one or more wiring levels and extending over said core region of said semiconductor substrate, a top surface of said electrical conductor coplanar with a top surface of said dielectric liner;
a dielectric layer on said top surface of said dielectric liner and said top surface of said electrical conductor; and
a wire in said dielectric layer contacting said electrical conductor; and
said direct current voltage is applied between said first and second electrically conductive contacts.

* * * * *